United States Patent
Ahn

(10) Patent No.: US 7,422,656 B2
(45) Date of Patent: Sep. 9, 2008

(54) DRY ETCHING METHOD AND APPARATUS FOR USE IN THE LCD DEVICE

(75) Inventor: Byung-Yong Ahn, Taegu (KR)

(73) Assignee: LG Display Co., Ltd., Seoul (KR)

( * ) Notice: Subject to any disclaimer, the term of this patent is extended or adjusted under 35 U.S.C. 154(b) by 349 days.

(21) Appl. No.: 11/014,801

(22) Filed: Dec. 20, 2004

(65) Prior Publication Data

US 2005/0101149 A1 May 12, 2005

Related U.S. Application Data

(62) Division of application No. 09/747,928, filed on Dec. 27, 2000, now Pat. No. 6,846,427.

(30) Foreign Application Priority Data

Feb. 19, 2000 (KR) ................... 2000-8044

(51) Int. Cl.
  *H01L 21/00* (2006.01)
  *C23C 16/00* (2006.01)
  *C23C 14/00* (2006.01)

(52) U.S. Cl. ............... 156/345.51; 156/345.47; 118/728; 118/723 R; 361/234; 279/128

(58) Field of Classification Search ............ 156/345.51, 156/345.47; 118/728, 723 R; 361/234; 279/128
See application file for complete search history.

(56) References Cited

U.S. PATENT DOCUMENTS

| | | | |
|---|---|---|---|
| 5,665,167 | A | 9/1997 | Deguchi et al. |
| 5,874,361 | A | 2/1999 | Collins et al. |
| 5,904,779 | A | 5/1999 | Dhindsa et al. |
| 5,985,104 | A | 11/1999 | Westwood |
| 6,096,572 | A | 8/2000 | Nakamura |
| 6,177,023 | B1 | 1/2001 | Shang et al. |
| 6,243,251 | B1 | 6/2001 | Kanno et al. |

FOREIGN PATENT DOCUMENTS

| | | |
|---|---|---|
| JP | 09-027538 | 1/1997 |
| JP | 10-209258 | 8/1998 |

*Primary Examiner*—Ram N. Kackar
(74) *Attorney, Agent, or Firm*—Birch, Stewart, Kolasch & Birch, LLP

(57) ABSTRACT

A dry etching step during the manufacturing of a substrate for a liquid crystal display (LCD) device is improved by placing the substrate at a predetermined distance away from the lower electrode to prevent damage of the substrate due to electrostatic formed therebetween. An insulating tape attached on the lower electrode provides electrostatic protection between the substrate and the lower electrode, so that the substrate is properly lifted off the lower electrode via the lifting pins of the lower electrode without electrostatic interference.

6 Claims, 4 Drawing Sheets

DRY ETCHING METHOD AND APPARATUS FOR USE IN THE LCD DEVICE

CROSS REFERENCE

This application is a Divisional of application Ser. No. 09/747,928, filed on Dec. 27, 2000, now U.S. Pat. No. 6,846,427 and for which priority is claimed under 35 U.S.C. §120; and this application claims priority of Application No. 2000-8044 filed in Korea on Feb. 19, 2000 under 35 U.S.C. §119; the entire contents of all are hereby incorporated by reference.

BACKGROUND OF THE INVENTION

1. Field of the Invention

The present invention relates to a liquid crystal display (LCD) device, and more particularly, to a dry etching method and apparatus for use in the LCD device.

2. Description of Related Art

FIG. 1 is a schematic view illustrating a typical liquid crystal display (LCD) device. As shown in FIG. 1, the LCD device 11 includes first and second substrates 7 and 22 with a liquid crystal layer having liquid crystal molecules 15 interposed therebetween. The first substrate 7 as an upper substrate includes a color filter 5 and a transparent common electrode 9 formed on the color filter 5. The second substrate 22 as a lower substrate includes pixel regions "P", pixel electrodes 18 formed on the pixel regions "P", gate lines 21 arranged in a transverse direction, data lines 26 arranged in a perpendicular direction to the gate lines 21, and thin film transistors (TFTs) "T" arranged near the cross points of the gate and data lines 21 and 26.

Each TFT includes an active layer, a gate electrode, and source and drain electrodes. The gate electrode contacts the gate line 21 and the source electrode contacts the data lines 26. Also, the drain electrode contacts the pixel electrode 18.

Components of the TFT, for example the active layer, the gate, source and drain electrodes and the like, are formed using a deposition technique, a photolithography technique, and an etching technique.

The etching technique includes dry-etching and a wet-etching. The dry-etching also includes plasma dry-etching, ion beam milling etching, and reactive ion etching. In wet-etching, acids and other chemical solutions are used as an etchant. In chemical dry-etching, for example the plasma dry-etching, plasma is used to generate gas radicals such as fluorine radicals in order to etch any portions of a thin film that are not covered by a photoresist. In physical dry-etching, for example the ion beam milling etching, an ion beam is used in order to etch any portions of a thin film that are not covered by the photoresist.

FIG. 2 is a schematic view illustrating a conventional dry-etching apparatus. As shown in FIG. 2, the dry-etching apparatus includes a process chamber 41, a cathode electrode 43 as an upper electrode to which voltage is applied, an anode electrode 45 as a lower electrode facing the cathode electrode 43 and having an top layer 48 on a substrate 49, and a RF (radio frequency) generator 50 that generates RF power.

The dry-etching process will be explained in detail hereinafter in reference with FIG. 2.

First, in the plasma dry-etching, the substrate 49 including the top layer 48 that is a dry-etching member is placed on the lower electrode 45 in the process chamber 41, and the process chamber 41 being a vacuum environment due to a vacuum device (not shown). Sequentially, etching gas containing an etchant suitable for the top layer 48 is injected into the process chamber 41 for reaction with any portions of the top layer 48 that are not covered by the photoresist (not shown). Reactive energy required for the etchant to react with any portions of the top layer 48 that are not covered by the photoresist is supplied from a plasma 47 generated by the RF generator 50. Reactive energy generated by the plasma 47 excites the etching gas molecules to a high energy level so that the etching gas molecules react with any portions of the top layer 48 that are not covered by the photoresist. At this point, if the top layer 48 is made of $SiO_2$, $CF_4$ can be used as gas plasma. The gas plasma of $CF_4$ reacts with $SiO_2$ so that a gas containing fluorine, silicon, and oxygen is produced, thereby etching the $SiO_2$ layer 48 arranged on the substrate 49. Thereafter, the gas of $CF_4$ is removed from the chamber by evacuation.

Second, the ion beam milling etching uses an ion beam instead of the reactive energy of the chemical dry-etching to etch any portions of the top layer 48 that are not covered by the photoresist. The process chamber 41 remains in a vacuum atmosphere by a vacuum device (not shown). Sequentially, heated argon (Ar) gases are injected into the process chamber 41 and the RF generator 50 generates the RF power to produce Ar gas plasma, that is, Ar gases are ionized. And then, DC power is applied from a DC power source (not shown) to the upper and lower electrodes 43 and 45, and Ar cations ($Ar^+$) are directed toward the lower electrode 45 and reacts with the top layer 48 on the substrate 49. Therefore any portions of the top layer 48 that are not covered by the photoresist are etched by ion beam confliction.

Finally, the reactive ion etching is a technique using both the chemical dry-etching such as the plasma etching, and the physical dry-etching such as the ion beam milling etching. Therefore, any portions of the top layer that are not covered by the photoresist are etched physically and chemically.

After the dry-etching process, a process of separating the substrate 49 from the lower electrode 45 follows. FIG. 3 is a perspective view illustrating an arrangement of the substrate 49 and the lower electrode 45. As shown in FIG. 3, the lower electrode 45 has a plurality of holes 51 receiving a plurality of lift pins 53 formed near two opposing end portions of the lower electrode 45. The lift pins 53 serve to lift the substrate 49 from the lower electrode 45 after the dry-etching process.

The substrate 49 is charged with electricity during the applying of RF power and, therefore capacitance is formed between the substrate 49 and the lower electrode 45 after the dry-etching process. Furthermore, an electrostatic force or sucking force occurs between the substrate 49 and the lower electrode 45 due to the interaction between positive and negative charges. Consequently, as shown in FIG. 4A, when the lift pins 53 are raised, the substrate 49 is undesirably bent at the edges due to the electrostatic force between a center portion of the substrate 49 and the lower electrode 45. Even though the substrate 49 is separated from the lower electrode 45, the substrate 49 attached to the lower electrode 45 may pop up suddenly and be deformed by strong elasticity. As a result, as shown in FIG. 4B, the substrate 49 may even fall off the lift pins 53, causing damage to the substrate 49. Further, in case that the substrate 49 falls off the lift pins 53, a carrier arm that carries the substrate in a subsequent process 49 can not accurately receive the substrate 49, or may damage the substrate 49 during processing. In order to overcome the problems described above, an additional process that removes the electrical charges between the substrate 49 and the lower electrode 45 is necessary and thus requires a complex, lengthy process.

SUMMARY OF THE INVENTION

In order to overcome the problems described above, a preferred embodiment of the present invention provides a dry etching method and an apparatus for use in an LCD device, which is not affected by electrostatic forces.

The present invention provides a dry etching method and an apparatus for use in an LCD device, which only requires a short processing time.

The preferred embodiment of the present invention provides a dry-etching apparatus, including: a process chamber having a gas inlet, the gas inlet allowing a reactive gas into the process chamber; a first electrode arranged at a predetermined location in the process chamber; a second electrode in the chamber spaced apart from and opposite to the first electrode, having an insulating tape thereon, a plurality of lift pins arranged in a plurality of corresponding holes, the insulating tape being arranged between the plurality of the lift pins; and a power source for applying voltages to the first and second electrodes.

The process chamber can be a vacuum chamber. The insulating tape can be a vacuum tape. The power source generates RF (radio frequency) power. The dry-etching apparatus further includes a DC (direct current) power source for applying DC voltages to the first and second electrodes.

The preferred embodiment of the present invention further provides a method for preventing an array substrate from being damaged due to an electrostatic force after a dry-etching process, including: providing a dry-etching apparatus having: a) a process chamber having a gas inlet, the gas inlet allowing a reactive gas into the process chamber; b) a first electrode arranged at a predetermined location in the process chamber; c) a second electrode in the chamber spaced apart from and opposite to the first electrode, having an insulating tape thereon, a plurality of lift pins arranged in a plurality of corresponding holes, the insulating tape being arranged between the plurality of the lift pins; and d) a power source for applying voltages to the first and second electrodes; arranging the array substrate on the second electrode; dry-etching the array substrate; and separating the array substrate from the second electrode using the lift pins.

The process chamber can be a vacuum chamber. The insulating tape can be a vacuum tape. The power source generates RF (radio frequency) power. The method further includes a DC (direct current) power source for applying DC voltages to the first and second electrodes. The dry-etching process can be a plasma dry-etching. The dry-etching process can be an ion beam milling etching or a reactive ion etching.

As described hereinbefore, employing the lower electrode having the vacuum tape thereon, the substrate is stably separated from the lower electrode without being affected by electrostatic force. Therefore, the production cost is reduced and yield is remarkably improved.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF PREFERRED EMBODIMENTS

Reference will now be made in detail to the preferred embodiment of the present invention, an example of which is illustrated in the accompanying drawings.

Figure 1:
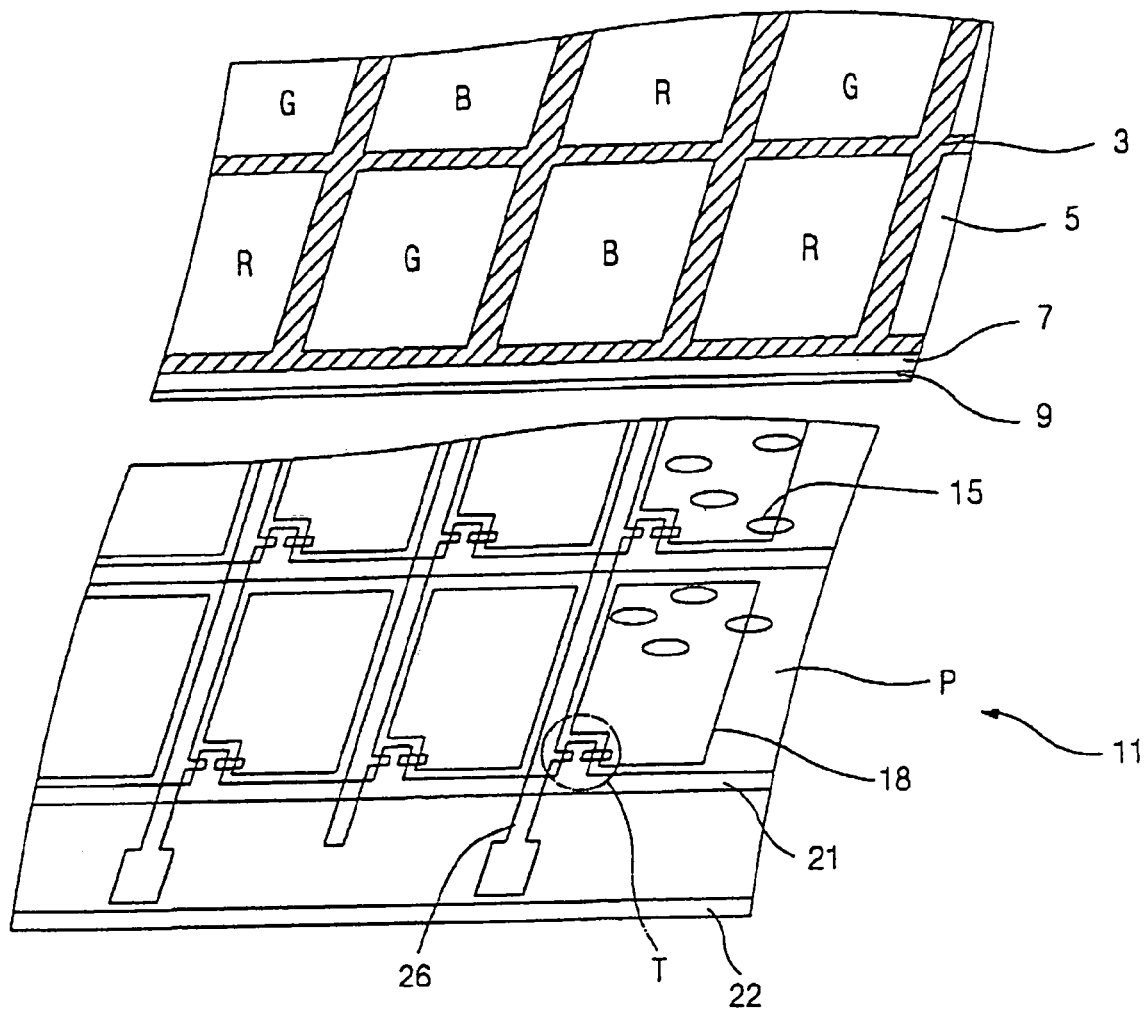
FIG. 1 is a schematic view illustrating a configuration of a conventional liquid crystal display device.
Figure 2:
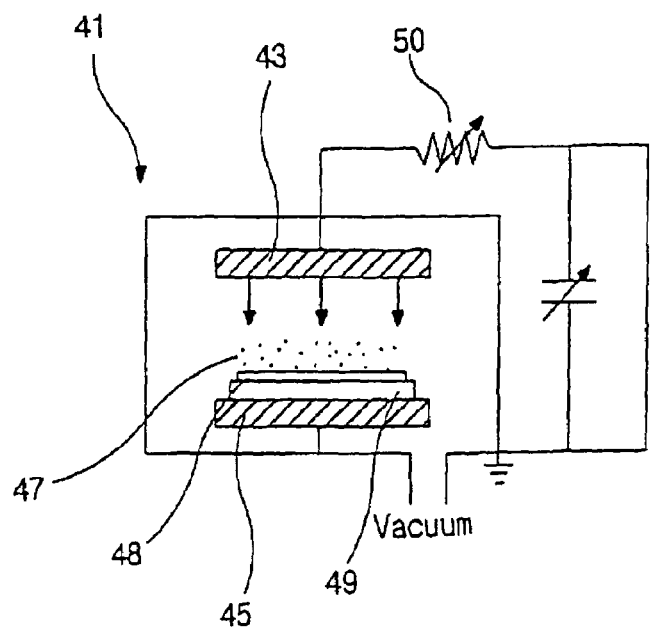
FIG. 2 is a schematic view illustrating a configuration of a conventional dry-etching apparatus.
Figure 3:
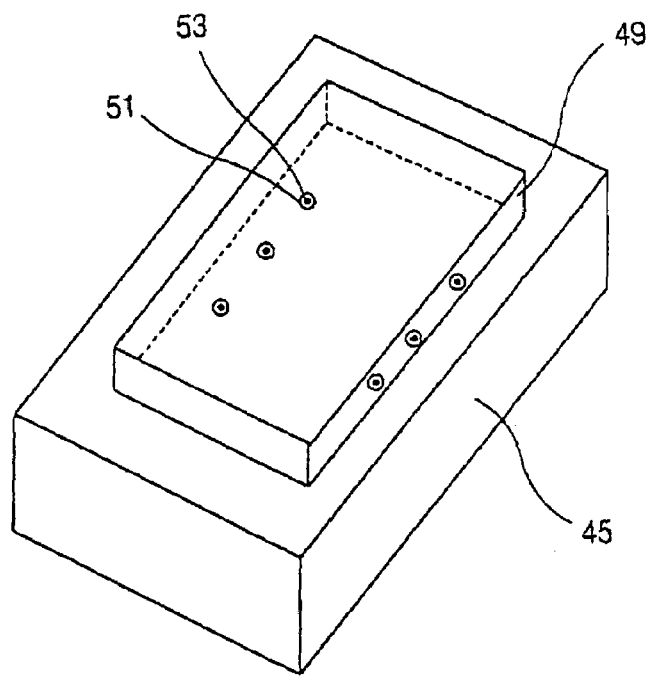
FIG. 3 is a perspective view illustrating a conventional arrangement of a substrate and a lower electrode arranged in the dry-etching apparatus.
Figure 4A:
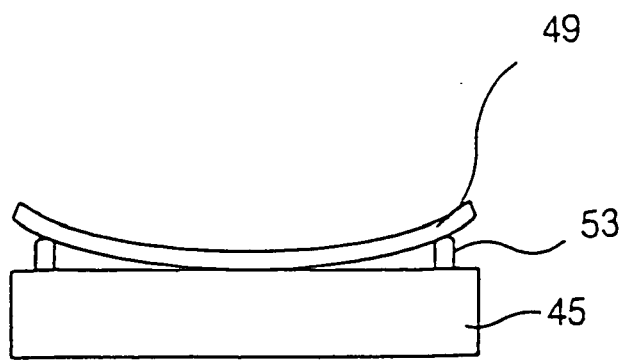
FIG. 4A is a schematic view illustrating a conventional state that the substrate is attached to the lower electrode due to static electricity.
Figure 4B:
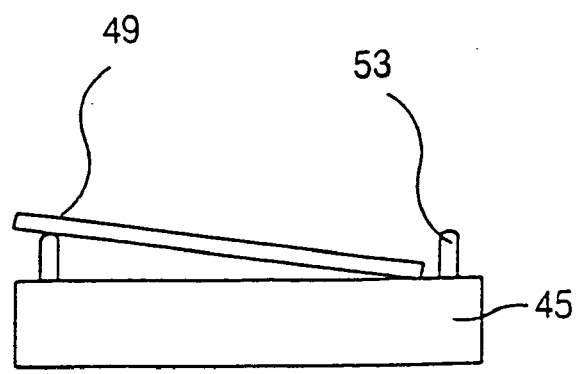
FIG. 4B is a schematic view illustrating a conventional state that the substrate is dislocated from the lift pins.
Figure 5:
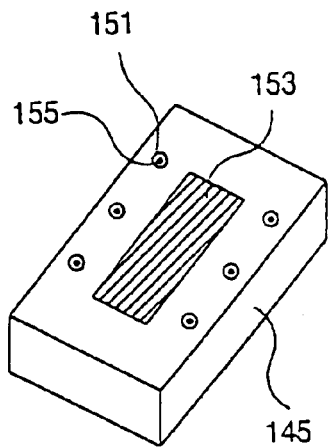
FIG. 5 is a perspective view illustrating a structure of a lower electrode of a dry-etching apparatus according to a preferred embodiment of the present invention.

FIG. 5 is a perspective view illustrating a configuration of a lower electrode 145 according to the preferred embodiment of the present invention. The lower electrode 145 has a plurality of lift pins 151, a plurality of holes 155 to receive the lift pins 151, and a tape 153. The tape 153 used in a vacuum environment is made of an insulating material and has characteristics that do not lower a vacuum degree, unlike a conventional adhesive tape that lowers a vacuum degree due to ingredients of a bonding agent. The tape 153 serves to distance the substrate 149 from the lower electrode 145, thereby decreasing the electrostatic force or sucking force therebetween.

At this point, the electrostatic force "F" is in proportion to an amount of charges and is in inverse proportion to a distance between two charges. The electrostatic force is shown as follows:

$$F = \frac{q1 q2}{4\pi \varepsilon r^2}$$

Where "F" denotes the electrostatic force, "q1" and "q2" are respectively positive and negative charges, "ε" denotes a dielectric constant, and "r" is a distance between the two positive and negative charges.

Further, the capacitance that represents an amount of charges is in inverse proportion to a distance between the two plate electrodes. The capacitance is shown as follows:

$$C = \varepsilon \frac{s}{d}$$

where "C" denotes capacity, "ε" denotes a dielectric constant ($\varepsilon = \varepsilon_0 \varepsilon_r$, $\varepsilon_0$ is a dielectric constant of a vacuum ($8.854 \ast 10^{-12}$) and $\varepsilon_r$ is a dielectric constant between the electrodes), "s" represents an area of a plate electrode, and "d" denotes a distance between the two plate electrodes.

As seen in Equations (1) and (2), the electrostatic force is proportional to the amount of charges and inversely proportional to the distance between the two plate electrodes or two positive and negative charges.

Thus, as a distance between the substrate 149 and the lower electrode 145 increase, the electrostatic force or sucking force between the substrate 149 and the lower electrode 145 decreases. As described above, the tape 153 serves to separate the substrate 149 from the lower electrode 145, thereby decreasing the electrostatic force or sucking force. That is, as distance "d" or "r" increases, the capacitance increases and, therefore the electrostatic force between the substrate 149 and the lower electrode 145 decreases. The material of the tape 153 includes a material that reduces the electric charges between the substrate and the lower electrode.

Figure 6A:
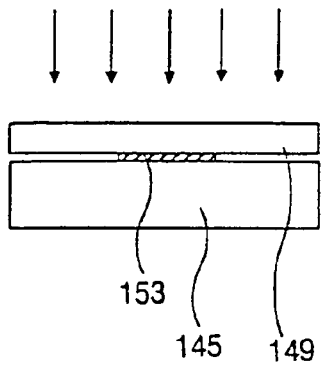
FIG. 6A is a cross-sectional view illustrating a substrate and a lower electrode arranged in the dry-etching apparatus according to the preferred embodiment of the present invention.
Figure 6B:
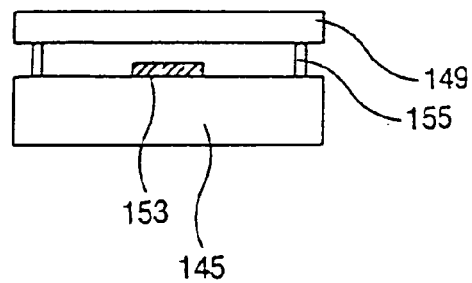
FIG. 6B is a cross-sectional view illustrating a state that a substrate is lifted by the lift pins of the lower electrode according to the preferred embodiment of the present invention.

As shown in FIG. 6A, the substrate 149 with the top layer etched is placed on the lower electrode 145 having the tape 153 after the dry-etching process. As shown in FIG. 6B, when the lift pins 155 are raised, the substrate 149 is stably separated from the lower electrode 145 without attachment of the substrate 149 to the lower electrode 145 due to the electrostatic force.

As described hereinbefore, employing the lower electrode having the tape 153 thereon, the substrate is stably separated from the lower electrode without being affected by the electrostatic force. Therefore, the production cost is reduced and yield is remarkably improved.

While the invention has been particularly shown and described with reference to preferred embodiments thereof, it will be understood by those skilled in the art that the foregoing and other changes in form and details may be made therein without departing from the spirit and scope of the invention. For example, the preferred embodiment of the present invention shows the use of a tape, but any element that can increase distance between the substrate and the lower electrode without affecting the vacuum environment as understood by those skilled in the art does not depart from the spirit of the invention.

What is claimed is:

1. A dry-etching apparatus, comprising:
   a process chamber having a gas inlet, the gas inlet allowing a reactive gas into the process chamber;
   a first electrode arranged at a predetermined location in the process chamber;
   a second electrode in the process chamber spaced apart from and opposite to the first electrode, the second electrode having a plurality of lift pins received in a plurality of holes, and an insulating tape, the insulating tape being arranged between the plurality of lift pins such that the pins are disposed beyond outer edges of the insulating tape, wherein the insulating tape is selected for having characteristics which do not lower a degree of vacuum, the insulating tape distancing a substrate and the second electrode such that the substrate and the electrode are spaced apart from each other to define a space beyond the outer edges of the insulating tape. and the distance between the substrate and the second electrode reduces an electrostatic attraction between the second electrode and the substrate prior to a lifting of the substrate; and
   a power source for applying voltages to the first and second electrodes.

2. The dry-etching apparatus of claim 1, wherein the process chamber is a vacuum chamber.

3. The dry-etching apparatus of claim 1, wherein the insulating tape is a vacuum tape.

4. The dry-etching apparatus of claim 1, wherein the insulating tape is located between the plurality of lift pins.

5. The dry-etching apparatus of claim 1, wherein the power source generates RF (radio frequency) power.

6. The dry-etching apparatus of claim 1, further comprising a DC (direct current) power source for applying DC voltages to the first and second electrodes.

* * * * *